US008111525B2

(12) United States Patent
Ong et al.

(10) Patent No.: US 8,111,525 B2

(45) Date of Patent: Feb. 7, 2012

(54) TOOL-LESS VERTICAL PCBA INSULATOR AND SUPPORT/SHIPPING BRACE

(75) Inventors: Brett C. Ong, San Jose, CA (US); William A. De Meulenaere, Newark, CA (US); Michael S. White, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 901 days.

(21) Appl. No.: 12/142,928

(22) Filed: Jun. 20, 2008

(65) Prior Publication Data

US 2009/0316369 A1 Dec. 24, 2009

(51) Int. Cl.
*H05K 7/12* (2006.01)

(52) U.S. Cl. ......... 361/801; 361/759; 361/747; 361/740

(58) Field of Classification Search .................. 361/732, 361/740, 747, 759, 801, 807, 809; 439/327
See application file for complete search history.

(56) References Cited

U.S. PATENT DOCUMENTS 5,268,821 A * 12/1993 Wong ............................ 361/796
5,847,923 A * 12/1998 Lee ............................ 361/679.4
6,409,518 B1 * 6/2002 Hung ............................ 439/61

FOREIGN PATENT DOCUMENTS

JP 04243198 A * 8/1992

* cited by examiner

*Primary Examiner* — Dameon Levi

(74) *Attorney, Agent, or Firm* — Osha • Liang LLP

(57) ABSTRACT

A brace for a circuit board vertically mounted on a motherboard includes a first attachment member capable of attaching to an edge of the circuit board distal from the motherboard; a second attachment member capable of attaching to a side edge of the motherboard; and a rigid support connecting the first attachment member and the second attachment member. The rigid support is shaped such that the circuit board is held substantially perpendicular to the motherboard when the brace is attached. An interference minimization device for minimizing the interference of a circuit board vertically mounted on a motherboard includes an attachment member capable of attaching to the circuit board at an end distal from the motherboard; a mating wall that is substantially parallel to the circuit board and abuts the circuit board when the interference minimization device is attached to the circuit board; and a tapered wall that widens from the distal end of the circuit board towards the motherboard.

19 Claims, 3 Drawing Sheets

103
103
100
102
101
104
500
504
101
103
102
103

TOOL-LESS VERTICAL PCBA INSULATOR AND SUPPORT/SHIPPING BRACE

BACKGROUND OF INVENTION

FIG. 1 shows a perspective view of a typical computer 100 with, for example, a top cover removed so as to expose the internal components. FIG. 2 shows a top view of the computer 100 shown in FIG. 1. As can be seen, the computer 100 has a motherboard 102 with various kinds of electronic parts 103 disposed thereon. Also, a circuit board 101 is vertically mounted on the motherboard 102. The circuit board 101 has various kinds of electronic parts 104 mounted thereon.

One side of the circuit board 101 is connected to the surface of motherboard 102, for example, by soldering, wave soldering, or other surface mount technology attachment methods known in the art. Alternatively, the circuit board 101 may be connected using a ball grid array or inserted into a connector mounted on the motherboard 102. In any case, the circuit board 101 is mounted roughly vertical to the motherboard 102. However, after connection or insertion, the circuit board 101 may not remain roughly vertical and instead will lean to one side at an angle relative to an axis perpendicular to the motherboard 102.

SUMMARY OF INVENTION

One or more embodiments of the present invention relate to a brace for a circuit board vertically mounted on a motherboard, comprising: a first attachment member capable of attaching to an edge of the circuit board distal from the motherboard; a second attachment member capable of attaching to a side edge of the motherboard; and a rigid support connecting the first attachment member and the second attachment member, wherein the rigid support is shaped such that the circuit board is held substantially perpendicular to the motherboard when the brace is attached.

One or more embodiments of the present invention relate to an interference minimization device for minimizing the interference of a circuit board vertically mounted on a motherboard comprising: an attachment member capable of attaching to the circuit board at an end distal from the motherboard; a mating wall that is substantially parallel to the circuit board and abuts the circuit board when the interference minimization device is attached to the circuit board; and a tapered wall that widens from the distal end of the circuit board towards the motherboard.

One or more embodiments of the present invention are made of an electrically insulating material. Other aspects and advantageous of the invention will be apparent from the following description and appended claims

DETAILED DESCRIPTION

Figure 1:
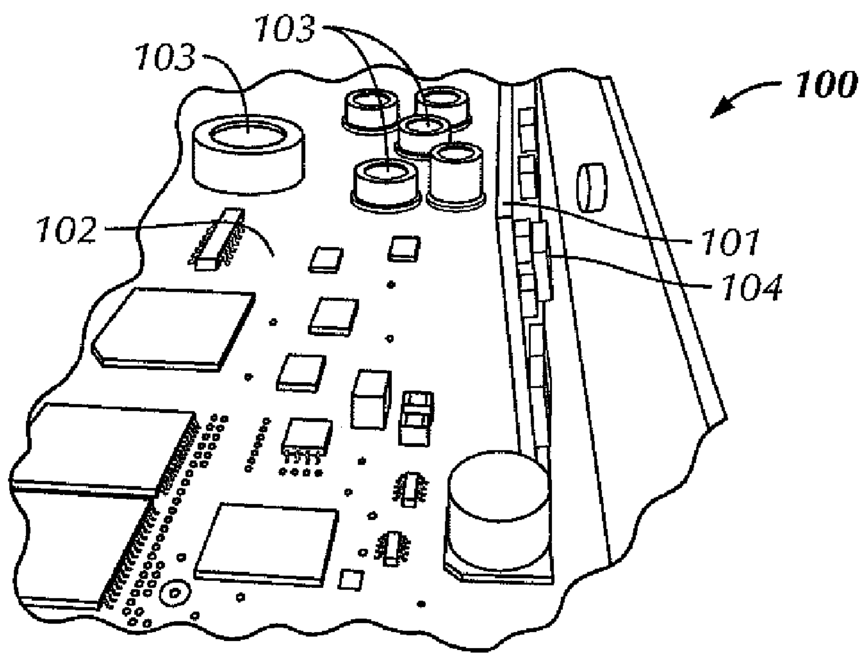
FIG. 1 shows a perspective view of a typical computer having a motherboard and a circuit board vertically mounted on the motherboard where a top cover is opened.
Figure 2:
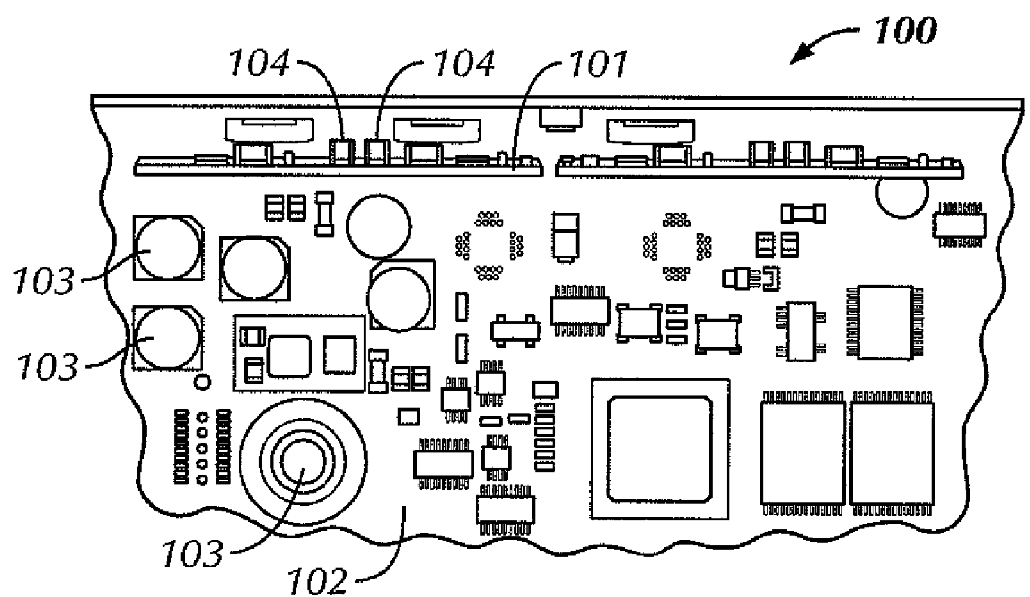
FIG. 2 shows a top view of the typical computer shown in FIG. 1.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, in a computer or a server having a motherboard and a circuit board, one side of the circuit board is mounted on the surface of motherboard by soldering, wave soldering, or other surface mount technology attachment methods known in the art. Alternatively, the circuit board 101 may be connected using a ball grid array or inserted into a connector mounted on the motherboard 102. In any case, the circuit board is mounted on the motherboard such that the circuit board is roughly vertical to the motherboard. However, after connection or insertion, the circuit board may not remain roughly vertical and instead will lean to one side at an angle relative to an axis perpendicular to the motherboard.

As computers have become more and more dense, the chance that the circuit board, the motherboard, or other components are damaged because of the leaning of vertically mounted circuit boards has increased. That is, vertically mounted circuit boards are more prone to damage if not kept substantially vertical relative to the surface of the motherboard. Accordingly, one or more embodiments of the present invention relate to a brace for a circuit board vertically mounted on a motherboard, an insulator for a vertically mounted circuit board, and an interference minimization device for minimizing the interference of a vertically mounted circuit board.

Figure 3:
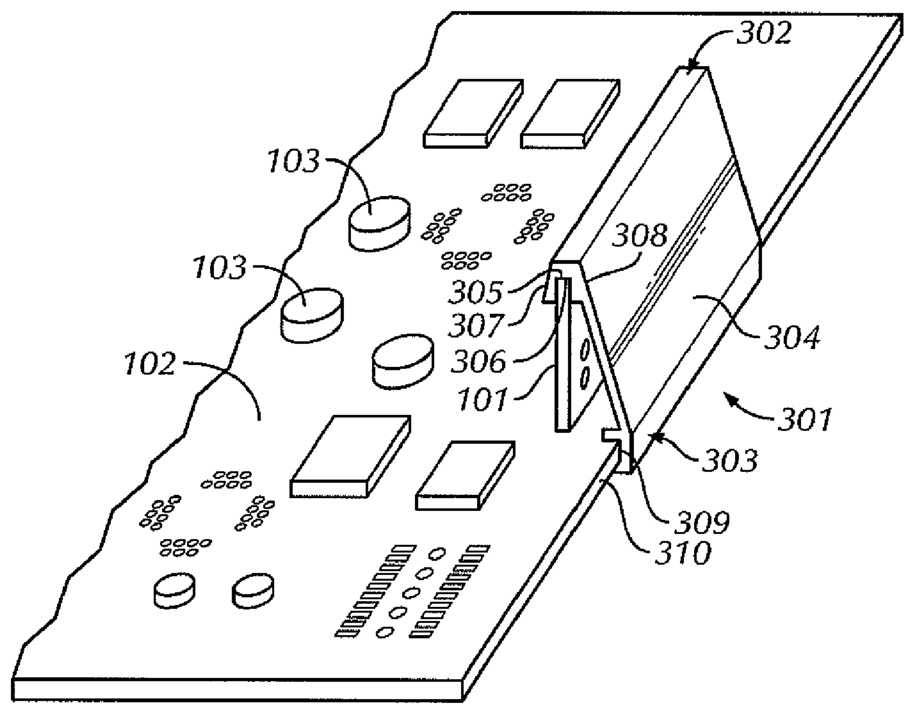
FIG. 3 shows a perspective view of a brace for a circuit board vertically mounted on a motherboard where the brace is installed to the motherboard and the circuit board in accordance with one or more embodiments of the present invention.
Figure 4:
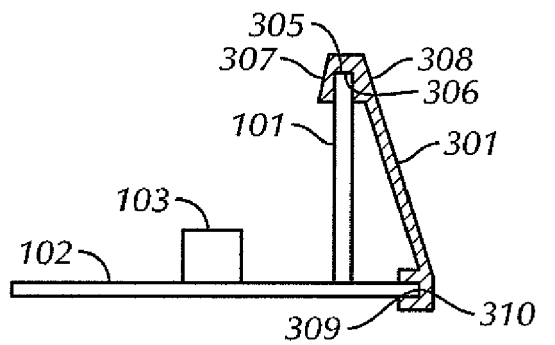
FIG. 4 shows a cross-sectional view of the brace installed to the motherboard and a circuit board shown in FIG. 3.

FIG. 3 shows a perspective view of a brace, in accordance with one or more embodiments of the present invention, for a circuit board vertically mounted on a motherboard. The brace 301 is installed on the side edge of the motherboard 102 and the edge of circuit board 101 distal from the motherboard. FIG. 4 shows a cross-sectional view of the brace installed to the motherboard and the circuit board shown in FIG. 3. As shown in FIG. 3, various kinds of electronic parts 103 are disposed on the motherboard 102. Also, various kinds of electronic parts 104 are disposed on the circuit board 101. The side edge of the circuit board 101 is mounted on the surface of the motherboard 102 of the computer 100.

As shown in FIGS. 3 and 4, the brace 301 has a circuit board attachment member 302, a motherboard attachment member 303, and a support 304. The circuit board attachment member 302, the motherboard attachment member 303, and the support 304 may be integral, and, thus, the brace 301 may be one piece. Additionally, the brace 301 may be made of high temperature resistant materials so that wave soldering of the circuit board 101 and other electronic components 103 to the motherboard 102 can be conducted even after the brace 301 is installed. Further, the brace 301 may be made of an electrically insulating material so that it is ensured that no short circuits are created by the brace. In fact, in such a case, the brace can act as an insulator for preventing short circuit of the electronic components 104 against, for example, the side walls of the computer 100.

The circuit board attachment member 302 has a recess 305 at the bottom thereof for receiving the side edge 306 of the circuit board 101 when the brace 301 is installed. Specifically, the recess 305 may be rectangular in shape and elongated from the one end of the circuit board attachment member 302 to the other end of the circuit board attachment member 302 along the center axis of the attachment member 302.

As can be seen from FIG. 4, the width of the recess 305 is approximately the same as the width of the circuit board 10 so that the brace 301 holds the side edge 306 of the circuit board 101 fixedly. Further, in one or more embodiments, the length of the recess 305 is approximately the same as the length of the side edge 306 of the circuit board 101 so that the side edge 306 of the circuit board is fully covered by the circuit board attachment member 302. One skilled in the art will appreciate that other sizes and the shapes of the circuit board attachment member 302 could be used so long as the brace 301 is capable of holding the side edge 306 of the circuit board 101 in place.

In one or more embodiments, the circuit board attachment member 302 has tapered portions 307 and 308 on both sides thereof. The tapered portion 307 widens from one top side surface of the circuit board attachment member 302 to the bottom surface of the circuit member attachment member 302. Also, the tapered portion 308 widens from the other top side surface of the circuit board attachment member 302 to the bottom surface of the circuit board attachment member 302 and extends continually to the support 304. The angle of the tapered portion 308 may be the same as the angle of the support 304 relative to the motherboard 102. Also, the top surface 309 of the circuit board attachment member 302 may be approximately flat and parallel to the motherboard 102. Alternatively, in one or more embodiments, the angled portions may continue until reaching a point or may be rounded off on top.

In addition, the angle of the tapered portions 307 and 308 may be adjusted according to the design of the circuit board 101 and the mother board 102. Also, in order to minimize the protrusions of the brace, each corner of the circuit board attachment member 302, the mother board attachment member 303, and the support 304 may be rounded. Further, one skilled in the art will appreciate that other sizes and positions of the brace 301 could be used depending on the design of the circuit board 101 and the mother board 102 so long as the circuit board 304 is held in place substantially perpendicular to the motherboard 102 when the brace 301 is attached.

The motherboard attachment member 303 also has a recess 309 at the side thereof such that a part of the side edge 310 of the motherboard 102 is inserted fully into the recess 309 when the brace 301 is installed to the mother board 102. As shown in FIG. 4, the width of the recess 309 in the side view is approximately the same as the thickness of the motherboard 102 so that the side edge 310 of the mother board 102 is held fixedly by the motherboard attachment member 303. Further, the top of the motherboard attachment member 303 is continually and integrally connected to the one edge of the support 304.

The support 304 rigidly connects the circuit member attachment member 302 and the motherboard attachment member 303 at the top and the bottom thereof respectively. Although the support 304 is a rectangular plane in shape in FIG. 3, one skilled in the art will appreciate that other shapes of the support 304 could be used so long as the circuit board 304 is held substantially perpendicular to the motherboard 102 when the brace 301 is attached. For example, the support 304 may be connected to a part of circuit board attachment member 302 and a part of the motherboard attachment member 303.

Accordingly, when the brace 301 is installed, the circuit board 101 is held substantially perpendicular to the motherboard 102 when the brace 301 is attached. As a result, the brace 301 minimizes the potential for interference of the circuit board 101 with other components 103, interference of the electronic components 104 on the circuit board 101 with the side walls of the computer 100, and interference of the circuit board 101 with users during installation of other components into the computer 100.

Further, because of the tapered portions 307, 308 and the support 304, the brace 301 if contact is made with the brace 301, for example, during installation of other components into the computer 100, the effect of the interference is minimized. Also, the tapered portions 307 can push other vertically mounted circuit boards (not shown) away from the circuit board 101.

When installing the brace 301 to the circuit board 101 and the mother board 102, the edge 305 of the circuit board 101 is inserted into the recess 306 of the circuit board attachment member 302, and, then, the edge 309 of the mother board 102 is inserted into the recess 310 of the mother board attachment member 303. Alternatively, the order may be reversed, or the brace may be installed on both edges at the same time. Accordingly, the brace 301 is easily installed onto the circuit board 101 and the motherboard 102 without tools even when the circuit board 101 is already mounted on the motherboard 102 and/or the motherboard 102 is mounted inside the computer 100. Also, for example, it is unnecessary to disconnect the circuit board 101 in order to install the brace 301. Thus, the design of the brace 301 realizes backwards compatibility.

Figure 5:
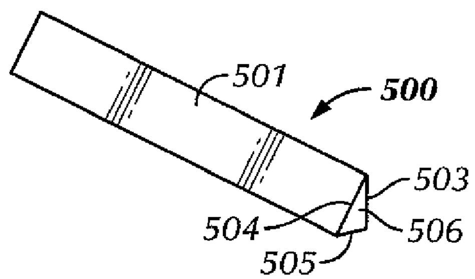
FIG. 5 shows a front perspective view of an interference minimization device in accordance with one or more embodiments of the present invention.
Figure 6:
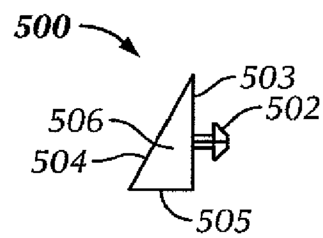
FIG. 6 shows a side view of the interference minimization device shown in FIG. 5.
Figure 7:
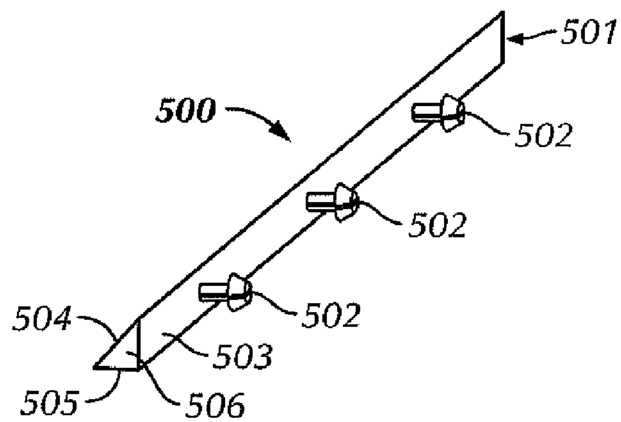
FIG. 7 shows a rear perspective view of the interference minimization device shown in FIG. 5.
Figure 8:
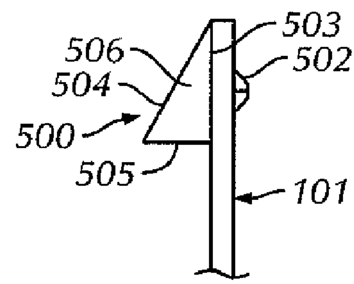
FIG. 8 shows a side view of the interference minimization device installed to a circuit board.

FIG. 5 shows a front perspective view of an interference minimization device in accordance with one or more embodiments of the present invention. FIG. 6 shows a side view of the interference minimization device shown in FIG. 5. FIG. 7 shows a rear perspective view of the interference minimization device shown in FIG. 5. FIG. 8 shows a side view of the interference minimization device installed to the circuit board.

As shown in FIGS. 5-8, the interference minimization device 500 has a main body 501 and three attachment members 502. The main body 501 further has a mating wall 503, a tapered wall 504, a bottom wall 505, and side walls 506, which may form a triangle in cross-sectional shape. Specifically, side walls 506 may be approximately parallel each other, and the mating wall 503 may be approximately perpendicular to the bottom wall 505 such that the tapered wall 504 has an angle relative to the mating wall 503.

Although three attachment members 502 are positioned on the mating wall 503 at the same intervals, as shown in FIGS. 5-8, one skilled in the art will appreciate that more or less attachment members 502 at different intervals could be used so long as the interference minimization device 500 is capable of being held on the surface of the circuit board 101 by the attachment members 502. The interference minimization device 500 acts to minimize the effect of interference in a similar manner to the tapered portions 307, 308 of the brace

301 described above. Also, in one or more embodiments, the interference minimization device 500 may be made of an electrically insulating material and may prevent short circuits similar to the brace 301 described above.

Figure 9:
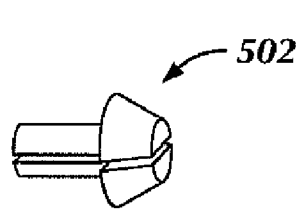
FIG. 9 shows an enlarged view of the attachment member.

FIG. 9 shows an enlarged view of the attachment member. As shown in FIG. 9, each of the attachment members 502 has a top portion 505 and a base portion 506. One end of the base portion 506 is connected to the mating wall 503, and the other end of the base portion 506 is connected to the top portion 505. The base portion 506 may have a thin cylindrical in shape. The width of the top portions 505 widens toward the base portion 506.

The circuit board 101 has openings at the distal end from the mother board 102. The width of openings is approximately the same as the width of the base portion 506, and the length of the base portion 506 is approximately the same as the length of the openings. Further, the width of the top portions 505 where the top portion 505 connects to the base portion is wider than the width of the base portion 506. Thus, the mating wall 503 is fixed tightly on the surface of the circuit board 101 when the top portions 505 pass through the openings. In addition, the top portion 505 may be elastic such that top portion 505 can pass through the openings.

One skilled in the art will appreciate that other shapes and structures known in the art could be used for the attachment members 502 so long as the mating wall 503 is tightly held on the surface of the circuit board 101 by the attachment members 502. For example, the top portions 505 may have slits disposed therein directed towards the base portions 506 so as to allow elastic deformation when passing through the openings in the circuit board 101.

Figure 10:
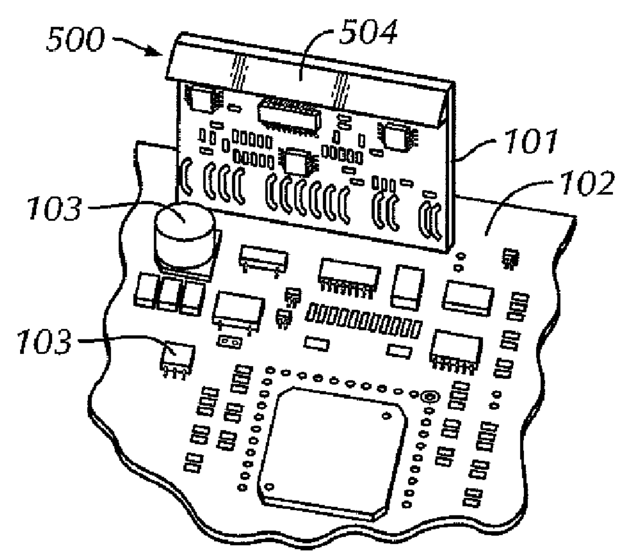
FIG. 10 shows a perspective view of the interference minimization device installed to a circuit board.

As shown in FIGS. 8 and 10, when the interference minimization device 500 is installed to the circuit board 101, the tapered wall 504 is tangential to the mating wall 503 around the top edge of the circuit board 101 so that the tapered wall 504 widens from the distal end of the circuit board 101 toward the motherboard 102. The angle of the tapered wall 504 relative to the circuit board 101 may be adjusted in order to minimize interference with other components.

Because most circuit boards include mounting holes disposed therein and the size, shape, and position of the attachment members 502 is variable, the interference minimization device 500 can be installed easily without tools and realizes backwards compatibility.

One or more embodiments of the present invention may have one or more of the following advantages. The brace provides a low cost brace for a vertical circuit board mounted on a mother board to support the vertical circuit board substantially vertical to the mother board. Specifically, the brace holds the circuit board substantially perpendicular to the mother board when the brace is attached to the circuit board. Further, the brace minimizes interference of the circuit board with other components. Additionally, the brace may insulate the components of the circuit board from short circuit.

The designs of the brace and the interference minimization device realize extremely simple and low-cost configurations. Also, the designs provide minimal protrusions with respect to the circuit board, in particular around the top of the circuit board, and minimize further interference with other components.

The tapered portions and the support of the brace, as well as the tapered wall of the interference minimization device, push other cards away from sensitive components that may be disposed on the circuit board or motherboard when installing the other cards. This prevents damage that could result. Also, the portions may be made of an electrically insulating material and prevent short circuit of electronic components.

While the invention has been described with respect to a limited number of embodiments, those skilled in the art, having benefit of this disclosure, will appreciate that other embodiments can be advised which do not depart from the scope of the invention as described therein. Accordingly, the scope of the invention should be limited only by the attached claims.

What is claimed is:

1. A brace for a circuit board vertically mounted on a motherboard, comprising:

a first attachment member capable of attaching to an edge of the circuit board distal from the motherboard;

a second attachment member capable of attaching to a side edge of the motherboard; and a rigid support connecting the first attachment member and the second attachment member, wherein the rigid support is shaped such that the circuit board is held substantially perpendicular to the motherboard when the brace is attached, and wherein the first attachment member comprises a tapered portion that widens toward the motherboard.

2. A brace for a circuit board vertically mounted on a motherboard, comprising:

a first attachment member capable of attaching to an edge of the circuit board distal from the motherboard;

a second attachment member capable of attaching to a side edge of the motherboard; and a rigid support connecting the first attachment member and the second attachment member, wherein the rigid support is shaped such that the circuit board is held substantially perpendicular to the motherboard when the brace is attached, and wherein the tapered portion is disposed on a side of the circuit board away from the edge of the motherboard.

3. The brace of claim 1, wherein the first attachment member has a first recess to receive the end of the circuit board distal from the mother board.

4. The brace of claim 1, wherein the second attachment member has a second recess to receive the side edge of the mother board.

5. The brace of claim 1, wherein the rigid support forms an angle relative to the motherboard similar to that of the tapered portion when the brace is attached.

6. The brace of claim 1, wherein the rigid support is a plane in shape.

7. The brace of claim 1, wherein the first attachment part, the second attachment part, and the rigid support are integrally formed.

8. The brace of claim 1, wherein a longitudinal width of the first attachment member is substantially similar to a longitudinal width of the circuit board.

9. The brace of claim 1, wherein the brace is made of high temperature resistant material.

10. The brace of claim 1, wherein the brace is made of an electrically insulating material.

11. An interference minimization device for minimizing the interference of a circuit board vertically mounted on a motherboard comprising:

an attachment member capable of attaching to the circuit board at an end distal from the motherboard;

a mating wall that is substantially parallel to the circuit board and abuts the circuit board when the interference minimization device is attached to the circuit board; and a tapered wall that widens from the distal end of the circuit board towards the motherboard.

12. The interference minimization device of claim 11, wherein the attachment member further comprising: a base portion connected to the mating wall; a top portion connected to the base portion, wherein the width of the top portion widens towards the base portion.

13. The interference minimization device of claim 12, wherein a width of the top portion is wider than a width of the base portion.

14. The interference minimization device of claim 12, wherein a width of the top portion is wider than a width of an opening in the circuit board.

15. The interference minimization device of claim 12, wherein the top portion is elastic so as to pass through the opening of the circuit board.

16. The interference minimization device of claim 11, wherein a longitudinal width of the interference minimization device is substantially similar to a longitudinal width of the circuit board.

17. The interference minimization device of claim 11, wherein the interference minimization device is made of high temperature resistant material.

18. The interference minimization device of claim 11, wherein the interference minimization device is made of an electrically insulating material.

19. The interference minimization device of claim 11, wherein the attachment member, the mating wall and the tapered wall are integrally formed.

* * * * *